United States Patent [19]
Wolfe et al.

[11] Patent Number: 5,047,131
[45] Date of Patent: Sep. 10, 1991

[54] METHOD FOR COATING SUBSTRATES WITH SILICON BASED COMPOUNDS

[75] Inventors: Jesse D. Wolfe, San Ramon; Carolynn Boehmler, Vacaville, both of Calif.; James J. Hofmann, Northfield, Minn.

[73] Assignee: The BOC Group, Inc., Murray Hill, N.J.

[21] Appl. No.: 433,690

[22] Filed: Nov. 8, 1989

[51] Int. Cl.$^5$ ............................................. C23C 14/14
[52] U.S. Cl. ............................................. 204/192.23
[58] Field of Search ...................... 204/192.23, 298.22

[56] References Cited

U.S. PATENT DOCUMENTS

| | | | |
|---|---|---|---|
| 3,798,146 | 3/1974 | Wan et al. | 204/192.27 |
| 3,826,728 | 7/1974 | Chambers et al. | 204/192.27 |
| 3,956,093 | 5/1976 | McLeod | 204/192.12 |
| 4,013,532 | 3/1977 | Cormia et al. | 204/192.15 |
| 4,022,947 | 5/1977 | Grubb et al. | 428/432 |
| 4,046,659 | 9/1977 | Cormia et al. | 204/192.12 |
| 4,125,466 | 11/1978 | Hartsough et al. | 210/724 |
| 4,131,530 | 12/1978 | Blum et al. | 204/192.14 |
| 4,166,018 | 8/1979 | Chapin | 204/192.12 |
| 4,356,073 | 10/1982 | McKelvey | 204/298.22 |
| 4,417,968 | 11/1983 | McKelvey | 204/298.22 |
| 4,422,916 | 12/1983 | McKelvey | 204/298.22 |
| 4,426,264 | 1/1984 | Munz et al. | 204/192.13 |
| 4,443,318 | 4/1984 | McKelvey | 204/298.22 |
| 4,445,997 | 5/1984 | McKelvey | 204/298.22 |
| 4,466,877 | 8/1984 | McKelvey | 204/298.22 |
| 4,534,841 | 8/1985 | Hartig et al. | 204/192.26 |
| 4,548,691 | 10/1985 | Dietrich et al. | 204/192.27 |
| 4,769,291 | 9/1988 | Belkind et al. | 204/192.23 |

FOREIGN PATENT DOCUMENTS

0165413B1 11/1985 European Pat. Off.
WO8607391 12/1986 PCT Int'l Appl.

Primary Examiner—John F. Niebling
Assistant Examiner—Steven P. Marquis
Attorney, Agent, or Firm—David A. Draegert; Robert I. Pearlman

[57] ABSTRACT

A method of depositing thin films of silicon based compounds, particularly silicon dioxide, by cathode reactive sputtering utilizes a rotating cylindrical magnetron driven by a d.c. potential. The result is a technique of forming a uniform film on large substrates with high deposition rates. Arcing normally associated with sputtering troublesome dielectric coatings such as silicon oxides is substantially eliminated.

13 Claims, 4 Drawing Sheets

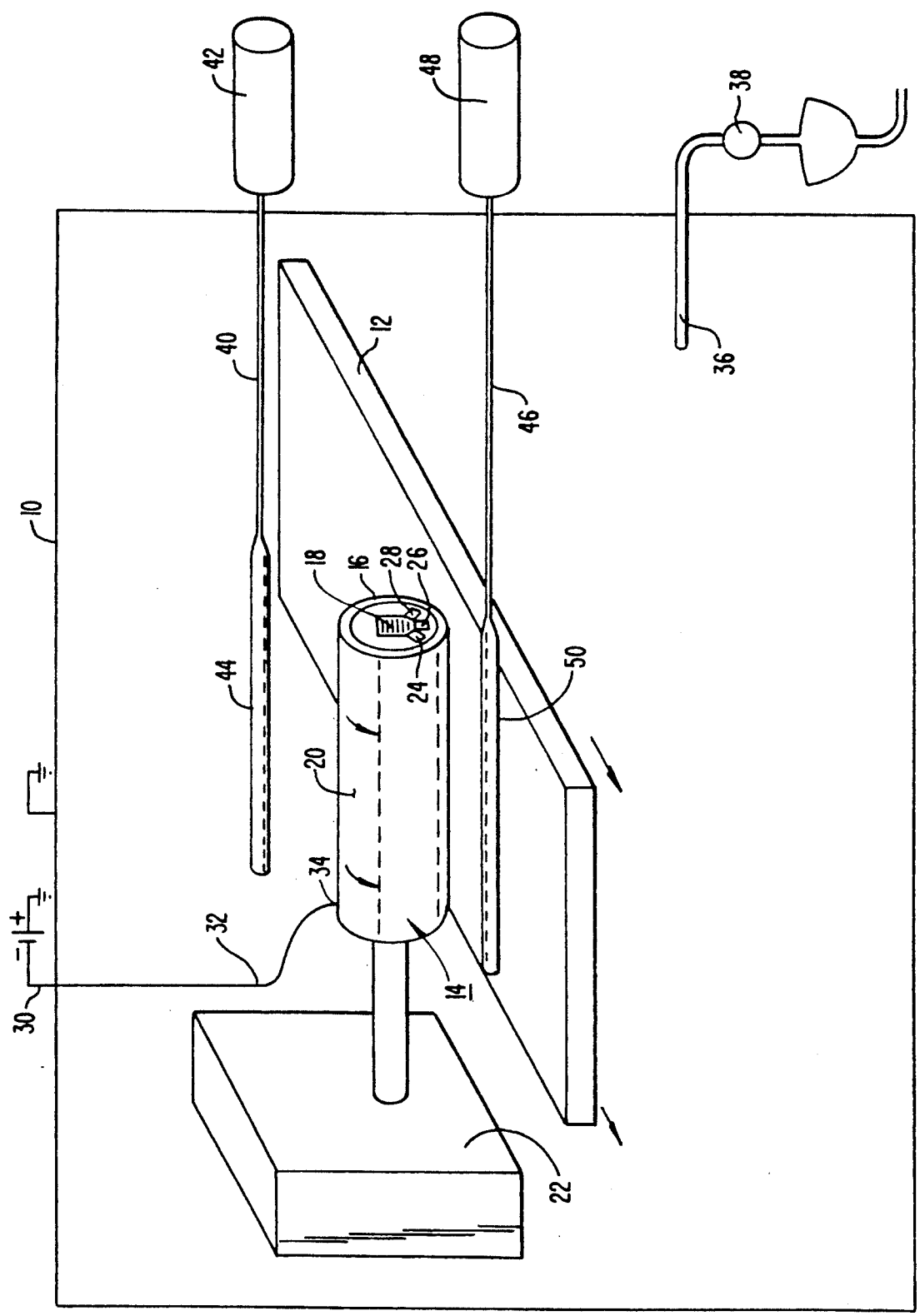
FIG._1.

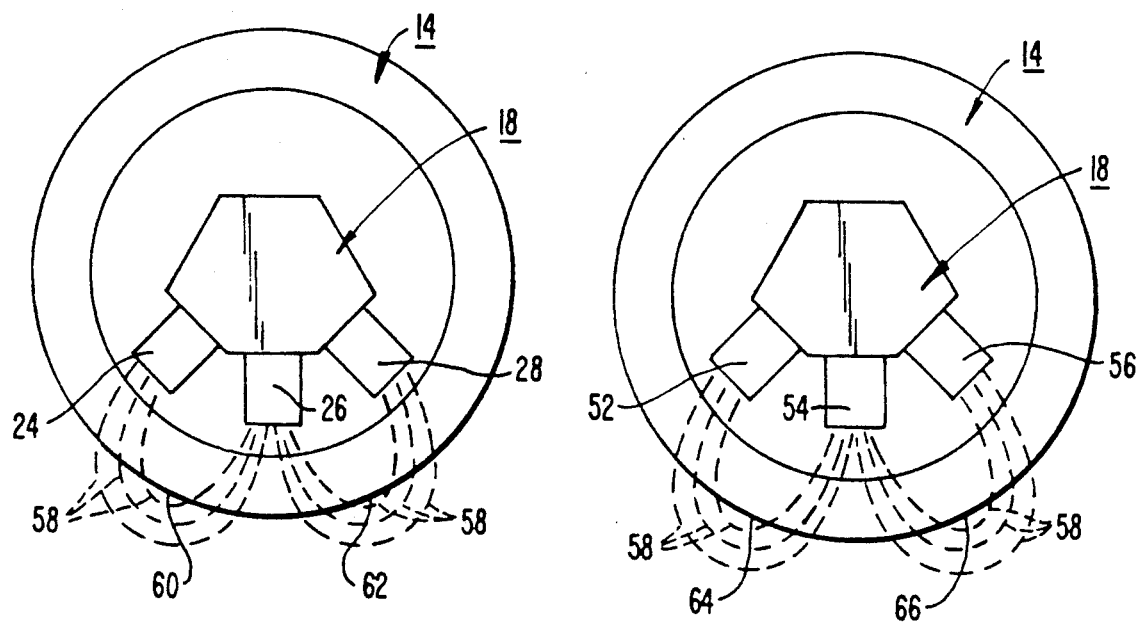
FIG._2.
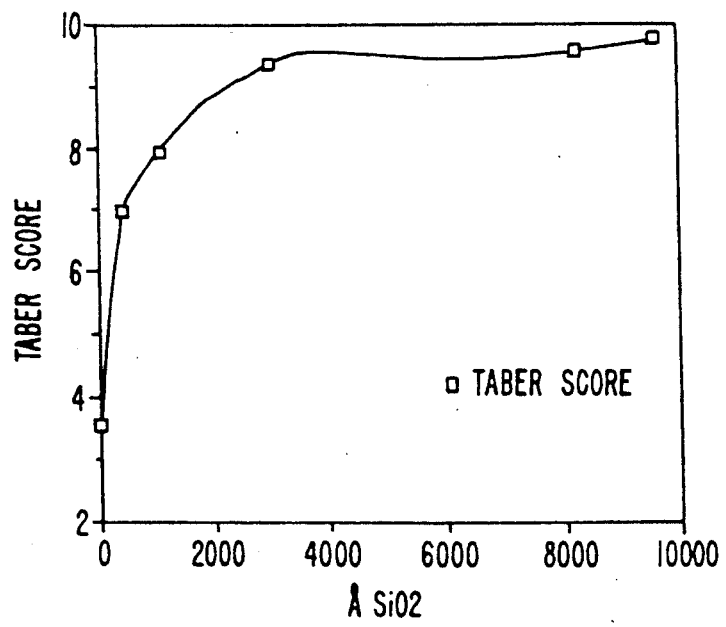
FIG._3.

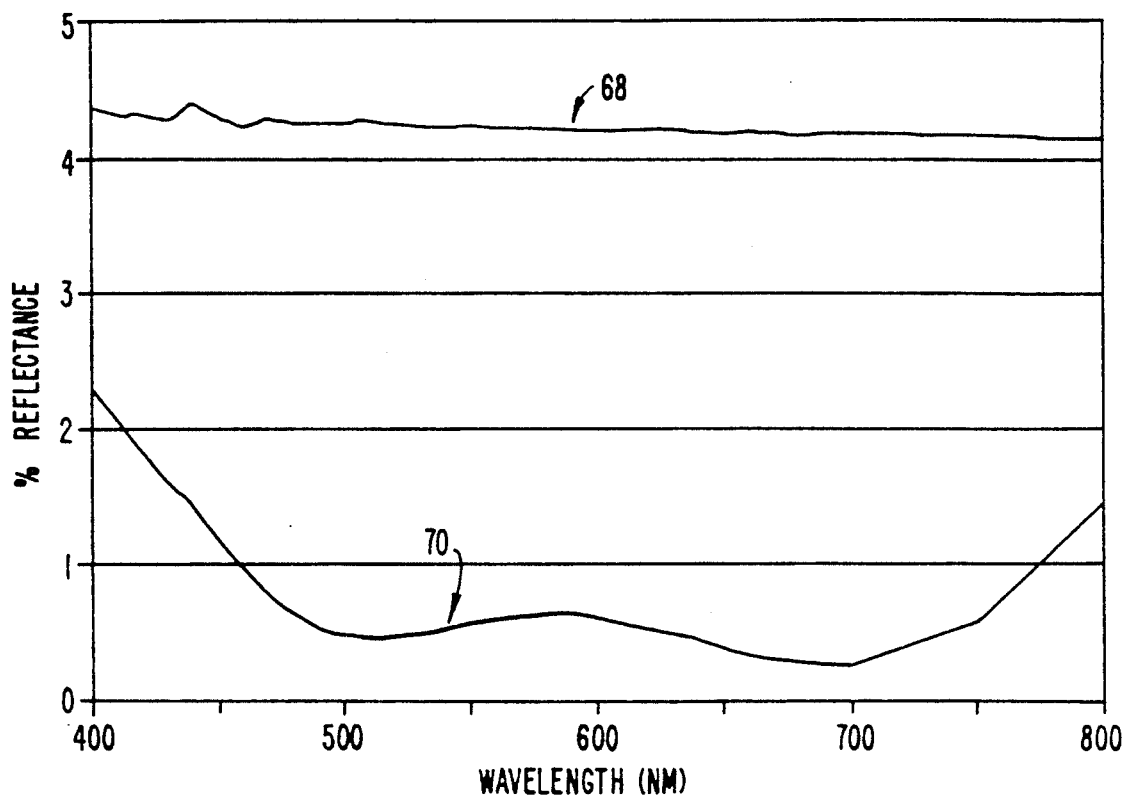
FIG._4.
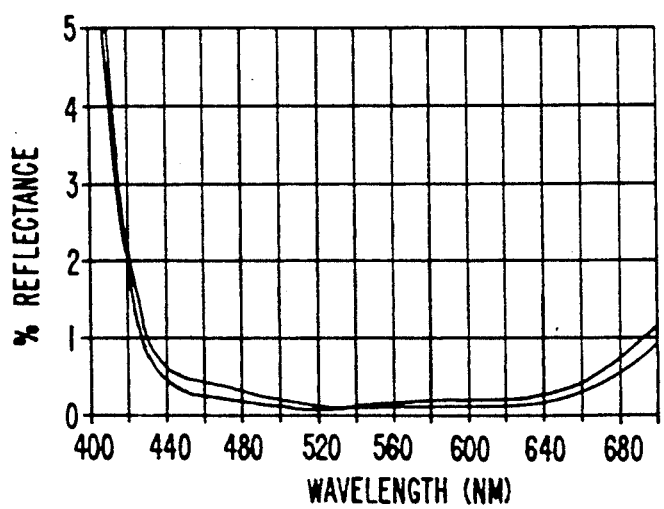
FIG._5.

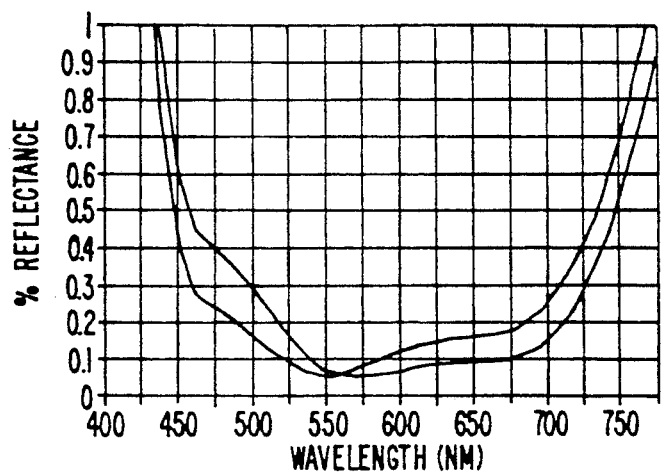
FIG._6.
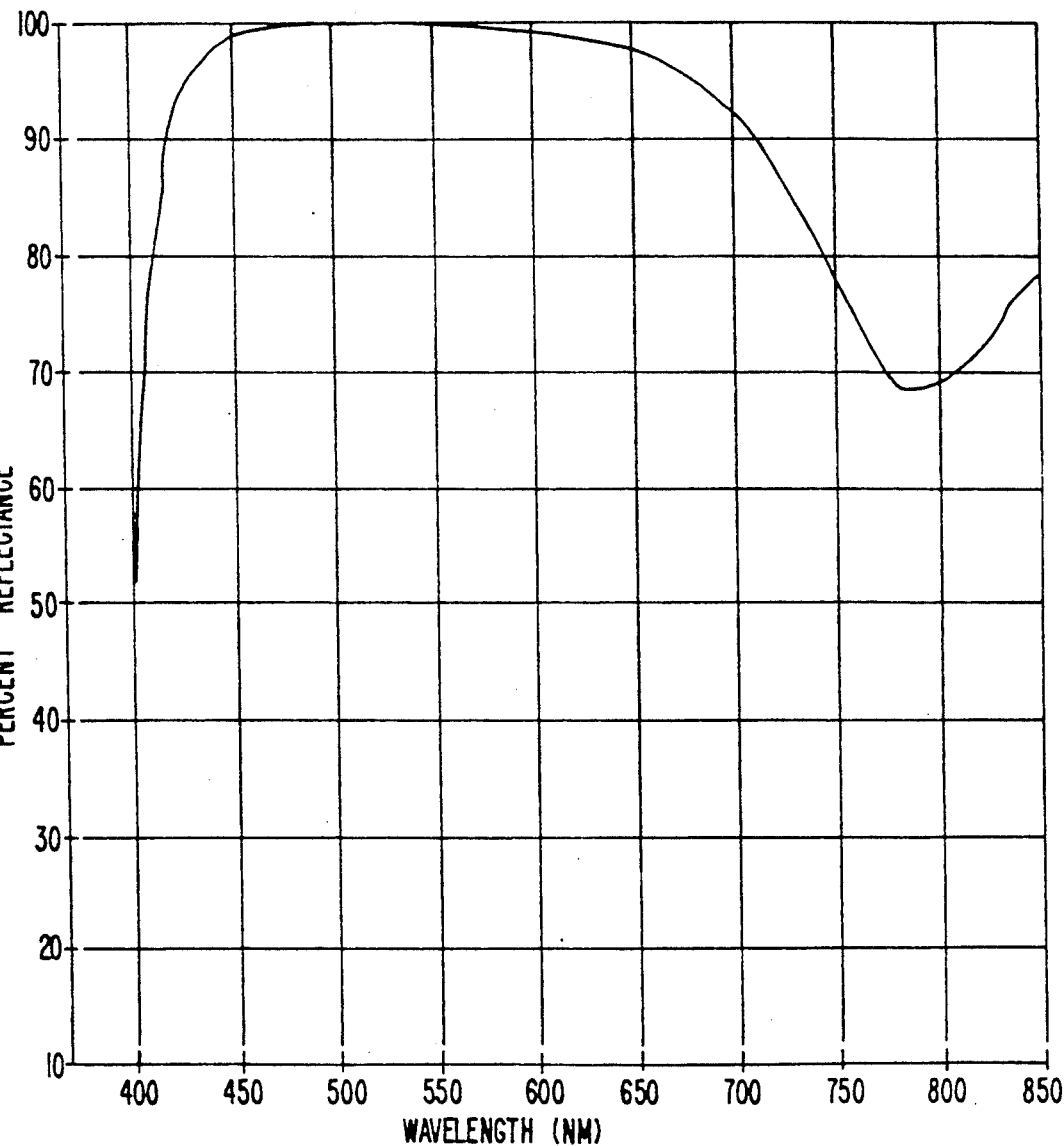
FIG._7.

METHOD FOR COATING SUBSTRATES WITH SILICON BASED COMPOUNDS

BACKGROUND OF THE INVENTION

This invention relates generally to a method of forming a film of dielectric material on a substrate, and more particularly to a technique for depositing films of silicon based compounds on substrates by reactive magnetron sputtering.

Silicon compounds, particularly silicon dioxide ($SiO_2$) play an integral part in current materials technology. For example, $SiO_2$ is utilized as a final protective coating on films that are subject to corrosion or abrasion, or as a layer material for multiple film structure. Typical applications include: architectural and automotive solar-control glass, mirrors (first- and second- surface), enhanced mirrors, barrier films (moisture and gas), electronic components, anti-reflection films and semiconductor devices.

Various processes are available for applying silicon based compounds onto substrates. For example, semiconductor wafers are coated in diffusion operations at high temperatures of over 1,000° C. However, because diffusion furnaces use radio frequency ("RF") power, the size and efficiency of these furnaces are severely limited. Other semiconductor processes including thermal oxidation and LPCVD (low pressure chemical vapor deposition) suffer from, among other things, slow deposition rates.

In addition, there are silicon oxide coating methods commonly referred as to "wet, dip and dry" methods for large-scale applications, including glass and antireflective coatings. However, these methods are inadequate for applications requiring high purity and precise, uniform film thickness on large scale substrates.

Reactive sputtering techniques have also been used to form silicon-based compound films. Sputtering is the physical ejection of material from a target as a result of ion bombardment of the target The ions are usually created by collisions between gas atoms and electrons in a glow discharge. The ions are accelerated into the target cathode by an electric field. A substrate is placed in a suitable location so that it intercepts a portion of the ejected atoms. Thus, a coating is deposited on the surface of the substrate.

In an endeavor to attain increased deposition rates, magnetically enhanced targets have been used. In a planar magnetron, the cathode includes an array of permanent magnets arranged in a closed loop and mounted in a fixed position in relation to the flat target plate. Thus, the magnetic field is caused to travel in a closed loop, commonly referred to as a "race track", which establishes the path or region along which sputtering or erosion of the target material takes place. In a magnetron cathode, a magnetic field confines the glow discharge plasma and increases the length of the path of electrons moving under the influence of the electric field. This results in an increase in the gas atom-electron collision probability. This leads to a much higher sputtering rate than that which is obtained without the use of magnetic confinement. Further, the sputtering process can be accomplished at a much lower gas pressure.

In operation, the magnetic confinement of the plasma results in a high rate of erosion of the target along the narrow "race track". As a result, only a relatively small portion of the total target material in the race track region is consumed before the target must be replaced.

In addition, with planar magnetrons, limited heat transfer and arcing have also imposed constraints on the choice of target materials and power levels. Arcing and the spitting of debris are problems associated with silicon oxides since they form good dielectrics. Major sources of arcing in a planar magnetron are the edges and the center of the target. Material deposited in these regions acquires a charge and arcs as its dielectric breakdown voltage is exceeded.

In reactive sputtering, a reactant gas forms a compound with the material which is sputtered from the target plate. When the target plate is silicon, and the reactive gas is oxygen, silicon oxide, usually in the form of $SiO_2$, is formed on the surface of the substrate. However, because silicon oxide is such a good insulator, a film thick enough to cause arcing is rapidly formed in areas of the target plate outside of the race track. Silicon oxide is known to be one of the hardest dielectric films to deposit by magnetron reactive sputtering, because of this characteristic. The arcing associated with silicon oxides has prevented planar magnetron reactive sputtering from being efficiently utilized to deposit quality silicon oxide films.

Numerous attempts have been employed to overcome such arcing problems and to find a better way to deposit silicon oxide films A great deal of effort has gone into improving planar magnetron reactive sputtering techniques for depositing silicon oxide and other films with a high degree of electrical insulation. Radio frequency (RF) power has been used instead of direct current (DC) potential in order to reduce the electrostatic build-up on the target surface. However, this has the concomitant effect of reducing the rate of deposition on the substrate as well. Also, the high magnitude of RF power that is necessary for large scale industrial coaters requires the use of an enormous power supply, and it is extremely difficult to avoid generating a level of radiation in the surrounding environment that interferes with electronic equipment. As another technique, baffles have been employed for shielding the areas of the target where the troublesome dielectric film forms. Further, the reactive gas has been confined to an area adjacent the substrate surface in order to attempt to minimize the amount of film deposition molecules that are permitted in the region of the target surface. Although these approaches have improved the process to some degree, they have not yielded a commercially practical technique, particularly for large scale industrial applications.

Therefore, it is a primary object of the present invention to provide an improved method of forming films of silicon based compounds on various substrates.

It is another object of the present invention to provide a magnetron reactive sputtering technique for depositing films of dielectrics with a high electrical insulating property without suffering the disadvantages discussed above.

SUMMARY OF THE INVENTION

These and additional objects are accomplished by the present invention, wherein, generally, a rotating cylindrical magnetron is used for depositing silicon based compounds, particularly a silicon oxide, and other good insulating dielectrics, by DC reactive sputtering.

The concept of a rotating cylindrical magnetron is generally known. In such a device, a cathode target assembly in the form of an elongated, cylindrical tube carries a layer of material applied to its outer surface that is to be sputtered. The target tube is rotated about its longitudinal axis. A magnetic structure is arranged inside the tube but does not rotate with it.

What is surprising is that deposition of the heretofore very troublesome dielectric films, particularly silicon dioxide and other silicon based compounds, is accomplished in this manner without formation of a layer of dielectric on the target surface that is thick enough to cause arcing. The apparent reason is that rotation of the target surface through the stationary plasma sputters the top layer of material from substantially its entire surface as that surface is rotated through the magnetic field. Any dielectric that is deposited on a portion of the target surface as it rotates outside the region of the magnetic field is apparently removed by sputtering when it again passes through the field. Thick layers of dielectric do not form, thereby reducing arcing. This phenomenon may be referred to as a "self-cleaning" characteristic of the rotating cylindrical magnetron. Furthermore, DC potential can be used in a rotating cylindrical magnetron, and at high levels because of superior cooling of the rotating cathode, thereby achieving high deposition rates. The invention is capable of precisely depositing silicon based compounds on large substrates.

Additional objects, advantages and features of the present invention will become apparent from the following detailed exemplary description, which description should be taken in conjunction with the accompanying drawings.

BRIEF DESCRIPTION OF THE DRAWINGS

FIG. 1 is a schematic representation of a rotating cylindrical magnetron sputtering system for deposition of dielectric films according to the present invention;

FIG. 2 is a cross-sectional view of dual cathode assemblies;

FIG. 3 is a graph of Taber score vs. thickness of a $SiO_2$ overcoat produced with the inventive method;

FIG. 4 is a graph comparing the percent reflectance of glass coated with a multi-layer $Si_3N_4$ and $SiO_2$ film with the percent reflectance of uncoated glass;

FIG. 5 is a graph illustrating the percent reflectance of glass coated with a multi-layer film of $Si_3N_4$ and $SiO_2$, burnished and unburnished;

FIG. 6 is a graph comparing the percent reflectance of glass coated on both sides with a multi-layer film of $Si_3N_4$ and $SiO_2$, burnished and unburnished; and FIG. 7 shows the percent reflectance of a multi-layer coating consisting of $Al-SiO_2-TiO_2-SiO_2-TiO_2$ films over the visible spectrum of light.

DESCRIPTION OF PREFERRED EMBODIMENTS

The method of the present invention will be explained with respect to implementing the rotating cylindrical magnetron that is generally illustrated in FIG. 1. A plasma is formed in an enclosed reaction chamber 10, in which a vacuum is maintained, where a substrate, such as substrate 12, is placed for depositing a thin film of material upon it. The substrate 12 can be any vacuum compatible material, such as metal, glass, and some plastics. The film can also be deposited over other films or coatings that have previously been formed on a substrate surface.

The cathode assembly 14 comprises generally an elongated cylindrical tube 16 mounted in the reaction chamber 10. An elongated magnet assembly 18 is carried within a lower portion of the tube 16, extends substantially its entire length, and is restrained against rotation with it. In order to be able to operate at high electrical power levels, desireable in order to have a high film deposition rate, the tube 16 is preferable cooled by passing water or another heat transfer fluid through it.

The tube 16 is formed of a suitable nonmagnetic material such as, for example, brass or stainless steel, and is of a diameter, wall thickness and length required for a particular operation to be performed. Applied to the outer surface of the tube 16 is a layer of a selected target material 20 to be deposited onto the substrate 12 being coated. In order to deposit a silicon based film on the substrate 12, this target material is pure silicon that is doped with a small percentage of a conductive material, such as aluminum, boron, antimony, phosphorus or arsenic, in order to render the target surface electrically conductive. The amount of dopant can be as high as approximately 10%, although less than 6% is better. The preferred amount is approximately as near zero as possible while achieving the necessary electrical conductivity. A concentration of approximately 2% is practically achieved by plasma spray techniques. The target material 20 is preferably applied to the core tube 16 by plasma spraying Thus, the tube 16 and the layer of coating material 20 constitute a tubular target or sputtering source as distinguished from the convention planar target.

The tube 16 is supported in a manner to be rotated about its longitudinal axis by a target drive system 22. The orientation of the longitudinal axis depends upon the shape and position of the substrate that is being coated. In the example being described herein, the substrate 12 is held horizontally and is flat, and the longitudinal axis of the tube 16 is also horizontal, thus being parallel with the substrate surface to be coated.

In a preferred arrangement, somewhat different from the schematic representation of FIG. 1, the tube 16 is rotatably held at each end in a horizontal position. A support structure at one end also allows cooling fluid to be introduced into the tube 16 and withdrawn from it, and contains a mechanism for driving the tube 16 from a motor source outside of the vacuum chamber 10. Rotating seals are included in this support structure for isolating the cooling fluid from the vacuum chamber. A support structure at an opposite end includes an electrical brush assembly for connecting the tube to a negative voltage.

The magnetic assembly 18 comprises an array of magnetic poles arranged in straight parallel rows along the length of the tube 16. Each row has three alternating magnetic poles 24, 26 and 28. In one configuration, the poles 24, 26 and 28 are arranged to have respective north, south and north polarities. An opposite configuration of respective south, north and south polarities may also be used. In either case, the magnetic poles 24, 26 and 28 are positioned in relation to the tube 16 so that their lines of force run from one pole, through the tube 16, and back through the tube in a curved path to an adjacent pole having an opposite polarity. This arrangement generates what is called a magnetic tunnel, which not only allows the sputtering rate to be increased, but also causes the target material 20 to be removed faster inside the tunnel, especially in the middle of this magnetic pattern.

The arrangement of the magnetic assembly 18 in FIG. 1 is a "W" configuration of three elongated magnets 24, 26 and 28. An alternative is a "U" configuration wherein a single magnet is position in the middle and a "U" shaped piece of magnetic material is positioned to form poles on either side of the magnet and of opposite polarity. In either case, it is usually desireable to position the pole faces as close to an inner surface of the tube 16 as possible. The magnetic assembly 18 is preferably supported within the tube 16 from a stationary axial rod or cooling fluid tube, or is held away from the inner surface of the tube 16 by rollers that are carried by the magnetic assembly 18, or both.

A cathode potential V sufficient to cause sputtering to occur is supplied to the tubular target 20 from a DC power source 30 through a power line 32 having sliding contact 34 with the tube 16 by a conventional electrical brush. The enclosure of the reaction chamber 10 is conductive and electrically grounded. It serves as an anode in the sputtering process. A separate anode may be optionally employed and maintained at a small positive voltage. Such an anode is a plane positioned above the target tube surface 20 and is preferably water cooled in order that high power levels may be employed.

In order to obtain the low pressure necessary for the coating operation to be performed, the reaction chamber 10 is provided with an outlet tube 36 communicating with a vacuum pump 38.

In order to provide the chamber 10 with the gases necessary for the coating operation, a gas supply system is included. A first gas supply tube 40 extends into the coating chamber 10 and from a source 42 of an inert gas. The inert gas is preferably argon for the specific methods being described. Nozzles 44 connected to inlet tube 40 distribute the inert gas in a region above the rotating cathode 14. It is the inert gas that breaks down into electrically charged ions under the influence of an electric field established between the target surface 20 and the grounded chamber enclosure or separate floating anode. The positive ions are attracted to and bombard the target surface 20, under the influence of the electric field, in an area to which they are guided by the magnetic field. This bombardment occurs primarily in two parallel strips, one between each of the opposing magnetic poles, along the length of the cylinder 14 at its bottom, opposite the magnet assembly 18. Thus, as the tube 16 is rotated, its target surface 20 is rotated through these two parallel strips.

A second gas supply tube 46 extends through the coating chamber 10 from a reactive gas source 48. When an oxide film is to be deposited, such as silicon oxide, the reactive gas is chosen to be pure oxygen. If a nitride film is to be deposited, such as silicon nitride, the reactive gas is chosen to be pure nitrogen. To form a silicon carbide film, the reactive gas is selected from hydrocarbon gases. Nozzles 50 connected to inlet tube 46 distribute the reactant gas close to and across the width of the substrate 12 being coated. Molecules of the reactive gas combine with molecules sputtered from the target surface, as a result of ion bombardment, to form the desired molecules that are deposited on the top surface of the substrate 12. Thus, silicon oxide films are deposited by use of the silicon material cylindrical target surface 20 and oxygen as the reactive gas.

Many variations in the gas supply system shown are practical as well. The inert and reactive gases from the sources 42 and 48 can be combined and delivered into the chamber 10 through a common tube and set of nozzles. When this is done, the delivery tube is preferably positioned along a side of the rotating target tube 16 and parallel with its longitudinal axis. Two such tubes can be used, one on each side of the target tube 16 and parallel with its longitudinal axis, each delivering the same combination of inert and reactive gases. Also, more than one reactive gas can be simultaneously supplied, depending upon the film being deposited. An example is to supply both oxygen and nitrogen in order to coat the substrate 12 with a silicon oxynitride film.

The film being formed does apparently become deposited on a surface portion of the target 20 after it leaves the region below the stationary magnetic structure 18, in the same manner as occurs on a planar magnetron target surface. But it has been found that this is no problem because the deposited film apparently is removed by the sputtering process when that surface portion again rotates through the region below the magnetic structure 18. It has also been found that this removal does not impair the quality of the film formed on the substrate 12, nor does it impact on the rate of deposition of the film.

The film is, however, deposited on other surfaces within the chamber 10 that are maintained at the large negative potential of the target surface 20. Such surfaces can exist in the supporting structures of the tube 16. If they do, it is highly desireable to cover them with a dielectric so that any deposited films will not have the large voltage surface immediately behind them and arcing will be avoided. If a positive voltage, floating anode is used, its surface is shaped and positioned away from such negative voltage surfaces in order to draw the plasma away from them and thus reduce deposition on them.

The example of FIG. 1 shows a single target assembly for simplicity, but it may be preferred to position two or more such assemblies adjacent each other with their tube longitudinal axes being parallel. This can result in an increased rate of deposition. FIG. 2 shows a cross-section view of dual cathode assemblies. It may be preferred, for large scale machines, that the magnetic poles of adjacent target assemblies which face each other be of opposite polarity. This restrains the plasma from extending upward between adjacent target assemblies. In this embodiment, the magnetic poles alternate in polarity so that if pole 28 is north, pole 52 is south, or vice-versa. As described previously, the magnetic field lines of flux 58 generate a magnetic tunnel wherein the sputtering is concentrated. Points 60 and 62 denote the approximate outer boundaries of the tunnel in one assembly and points 64 and 66 denote the approximate outer boundaries of the other.

Additional structural and operational details of a rotating magnetron of the type described with respect to FIG. 1 may be had by reference to a patent application of Alex Boozenny et al, entitled "Rotating Cylindrical Magnetron Structure for Large Area Coating," Ser. No. 07/433,653 filed Nov. 8, 1989, the disclosure of which is incorporated herein by reference.

EXPERIMENTAL RESULTS

The method according to the invention provides durable silicon based compound coatings which can be deposited at relatively high rates. To demonstrate the method's effectiveness, films of silicon oxide ($SiO_2$) and $Si_3N_4$ were prepared on different substrates and were tested for their mechanical and optical properties and deposition rates. It is known that $SiO_2$ is the predominant form of silicon oxide created in the sputtering process. However, it is believed that other forms are produced as well. Thus, unless otherwise stated, SiO$_2$ will represent all forms of silicon oxide produced by the inventive method. In addition, by utilizing reactive gas mixtures more complex silicon compounds are sputtered. For instance, when the mixture consists of oxygen and nitrogen, Si$_x$O$_y$N$_z$ is deposited, where x, y and z represent different stoichiometric amounts of silicon, oxygen, and nitrogen of the various compounds formed. Furthermore, by regulating the process conditions, particularly the flow rates of oxygen and nitrogen and the pressure of the reaction chamber, x, y and z can be controlled.

Experiments utilizing the inventive method were originally conducted in a research size in-line cylindrical magnetron of the type shown in FIG. 1 manufactured by Airco Coating Technology, a division of Assignee. The same results were later duplicated in a larger cylindrical magnetron, the C-Mag ™ model 3000 cathode, also manufactured by Airco under substantially the same process conditions. In addition, more sophisticated applications of the inventive method are possible with the model 3000. The research coater is capable of substrate sizes up to 16 inches wide, whereas the larger coater was capable of substrate sizes up to 1 meter wide. Research coaters normally operate at approximately 3 kw power whereas the model 3000 normally operates between 30 to 40 kw. Tests indicate that the research and model 3000 produce film of the same quality. Both systems use untrapped diffusion pumps that achieved a base pressure in the 10$^{-6}$ Torr range before operation. Argon was used as an inert gas and either oxygen or nitrogen was used as the reactant gas. The partial pressure of the gases was determined by the transition from the oxide or nitride mode to the metallic mode. Experiments were run as close to that transition as practicable. The pressure and flow rate of the sputtering gases were controlled by conventional devices.

The power applied varied for the different target materials but for the most part it was comparable to the maximum obtainable with similar size planar magnetrons. Each sputtering source was connected to an appropriate direct current power source having provision for automatically maintaining the voltage, current or power, as desired.

Because the electrical conductivity of pure silicon is so low that it is unsuitable for sputtering with direct current, the silicon target was impregnated or doped with a small amount of aluminum in the range of from 2-4%. The target was prepared by plasma spray.

The film deposited according to the invention contains reaction products of aluminum and silicon with the reactive gas. When the reactive gas was oxygen, the deposition coating contained a mixture of aluminum and silicon oxides. It is believed that the percentage of aluminum oxides in the film is approximately equal to the percentage of aluminum in the target. The amount of aluminum oxides increases proportionally with the amount of aluminum in the target. When other substances are used as dopant, a similar correlation between the amount of dopant in the target and the amount of the dopant oxide is seen. When the sputtering gas was nitrogen, the coating contained a mixture of aluminum and silicon nitrides. All of these four components are relatively hard and form an amorphous film that acts as a strong barrier. However, the amount of aluminum in the film did not interfere with formation of the desired silicon based compound films. In the course of the experiments, two silicon compound films were sent out for independent RBS (Rutherford Back-Scattering) sampling to determine the composition of the compound. The silicon oxide measured 36% Si/64% O, and the silicon nitride measured 42% Si/57% N. These percentages are very close to the theoretical 1:2 ratio for oxide and the 3:4 ratio for nitride.

The target was conditioned using an inert gas, then the process gas was added until the desired partial pressure was reached. The process was operated at that point until the process was stabilized. The substrates were then introduced to the coat zone and the film was applied. The substrate used was typically soda lime glass, but, depending on the test, could be any combination of the following: microscope slide, Corning 7059 glass, 0.5 mil PET (poly(ethylene terephthalate)) film, fused silica stressed disc or carbon planchet.

Deposition Rate: The deposition rates for the production of SiO$_2$ and Si$_3$N$_4$ utilizing the inventive method were measured and compared with deposition rates of other films applying the same process.

Various factors affect deposition rates, including gas partial pressure, source-to-substrate distance, system cleanliness, magnet design, and chamber geometry, which accounts for the range of deposition rates listed below. For the materials studied, the dynamic deposition rate (DDR) for the cylindrical magnetron was similar to, or greater than, the equivalent rate for a planar under the same conditions.

Physical thickness of the films was measured using a Sloan Dektak IIA Profilometer. The films were produced by depositing over lines drawn by a permanent marker followed by delaminating the film over the line in an ultrasonic alcohol bath. The sputter efficiency, or DDR, was calculated for each film using the physical thickness and deposition parameters in the equation given by Waits (see R. K. Waits, *Thin Film Processes*, page 150, Academic, Press, N.Y., 1978):

$$DDR(\text{Å}mm^2/Joule) = (d*C*S)/(P*n)$$

Where:
d = Thickness of the film in angstroms
C = Racetrack length of the target in mm
S = Conveyer speed in mm per second
P = Power applied in watts
n = Number of passes.

Below is the typical range of dynamic deposition rates obtained with the cylindrical magnetron applying the inventive method:

| Film | DDR |
|---|---|
| SiO$_2$ | 700–1100 |
| Si$_3$N$_4$ | 900–1400 |

Abrasion Resistance: The durability of SiO$_2$ films and Si$_3$N$_4$ produced by the inventive method was measured with a Taber Abrader. A CS10F wheel with 500 gram weights was used. For the standard Taber score the sample was rotated under the wheels for 50 revolutions. The area of the abrade was observed through a microscope at 50 times magnification and a picture was taken. Four 1"×1" squares were drawn on the picture in random places and the number of scratches inside these squares was counted. The number of scratches in all four squares was averaged and the part was given a Taber score based on the following formula:

TABER SCORE=#SCRATCHES*(−0.18)+10

The Taber score is a linear scale where no scratches is a 10, and 50 scratches is a 0. For reference, uncoated soda lime glass typically scores about 9.0.

Silicon oxide films of different thicknesses were coated on VWR (Vanwater and Rogers Co.) slides. The cathode was run at 2.0 kW and the line speed was 20″/min. The other operating conditions of the cylindrical magnetron were comparable to those set forth in Table 1 below. 4″×4″ samples were cut from each run for Taber Abrader tests. The results indicate that a 900 Å thick sample had a Taber score of 9.40 and a 3000 Å sample had a Taber score of 9.70. FTIR analysis showed the film to be relatively pure and free of contamination. SEM cross-section analysis showed that the $SiO_2$ was dense and amorphous.

The following table shows typical Taber scores for some of the compounds studied:

| Compound | Cylindrical Magnetron Taber Score | Planar Taber Score |
| --- | --- | --- |
| $SiO_2$ | 9.6 ± .2 | 9.55 ± .2* |
| $Si_3N_4$ | 9.45 ± .3 | 9.3 ± .6* |
| $TiO_2$ | 8.5 | 8.5 |

*The planar silicon compounds were produced using an RF enhanced system.

Protective Overcoat of Soft Undercoat: A study of the abrasion resistence of a $SiO_2$ overcoat on a very soft film was done. Super-H ® film is a solar control, low emissivity film developed by Airco; it is relatively soft because it uses metal as one of its layers. By applying a hard, but relatively neutral film such as $SiO_2$, its durability should be improved without impacting the optical properties. Glass substrates previously coated with Super-H ® film were coated with silicon oxide films of different thicknesses. The cathode was run at 2.0 kW and the line speed was 20″/min. except for the 8250 Å sample where the speed was 2.3″/min. The other operating conditions of the cylindrical magnetron were comparable to those set forth in Table 1 below. The Taber scores for various samples are tabulated as follows:

| $SiO_2$ Thickness (Å) | Taber Score |
| --- | --- |
| uncoated | 3.57 |
| 445 | 6.94 |
| 1063 | 7.93 |
| 3000 | 9.37 |
| 8250 | 9.55 |
| 9600 | 9.76 |

FIG. 3 graphically illustrates the above results.

$SiO_2$ as a Barrier Layer: On a 6″×6″ PET sample, a 3000 Å film of $SiO_2$ was prepared. In this particular example, during the sputtering process which took 31 minutes, the substrate sample was passed through the plasma 16 times. Table 1 sets forth the process data for production of the oxide. Beginning at zero, Time refers to the lapsed time in the process. The Potential refers to the potential between the cathode assembly tube and the ground. The Power refers to the power supplied and the Current was measured at the power source. The flow rates of the inert gas (Ar) and reactive gas ($O_2$) were measured in standard cubic centimeters per minute (SCCM). The Pressure of the reaction chamber is measured in microns. Finally, the Number of Passes refers to the number of times the substrate had crossed the plasma during the sputtering process at a particular time. For instance, at time 23 minutes into the process, the substrate was making its 13th pass.

TABLE 1

| Time (min) | Power (kW) | Potential (V) | Current (A) | SCCM $O_2$ | SCCM Ar | Pressure (μ) | No. Passes |
| --- | --- | --- | --- | --- | --- | --- | --- |
| 0 | 3.0 | 481 | 6.30 | 10 | 23 | 0.98 | 1 |
| 6 | 3.0 | 500 | 6.06 | 10 | 23 | 1.10 | 4 |
| 13 | 3.0 | 490 | 6.18 | 10 | 23 | 0.99 | 7 |
| 17 | 3.0 | 500 | 6.14 | 10 | 23 | 1.09 | 10 |
| 23 | 3.0 | 503 | 6.06 | 10 | 23 | 1.05 | 13 |
| 31 | 3.0 | 506 | 6.02 | 10 | 23 | 1.10 | 16 |
| | | | | | Total No. of Passes: | | 16 |

Water permeation testing was done on a Mocon Permatran and oxygen testing was done on a Mocon Ox-Tran Twin. In one test, approximately 3000 Å of $SiO_2$ was applied to a 6″×6″×0.5 mil PET sample. This was tested for water permeation, an uncoated sample had a measured transfer of 43.4 grams/m²/day while the coated sample only had a transfer of 3.3 grams/m²/day.

In another test approximately 3000 Å of $Si_3N_4$ was applied to a 6″×6″×0.5 mil PET sample. This was tested for oxygen permeation. At 32° C. the uncoated sample had a transfer of 161.2 cc/m²/day while the coated sample had a transfer of 5.96 At 25° C. the uncoated sample had a transfer of 23.89 cc/m²/day while the coated sample had a transfer of 4.7 cc/m²/day.

Optical Characteristics of Plain $SiO_2$: A VWR slide coated with a 8250 film of $SiO_2$ under similar conditions as set forth in Table 1 was tested for various optical and physical characteristics as tabulated hereinbelow:

| | |
| --- | --- |
| Index of refraction at 520 nm | 1.46 |
| % Transmittance (integrated D65 source)* | 91.98 |
| % Reflectance (single surface integrated D65 source)** | 3.42 |
| % Absorbance | 0.70 |
| | (or 8.48 × 10⁻⁶ % A/Å) |

*The uncoated slide had a % transmittance of 92.27
**The uncoated slide had a % Reflectance of 3.83.

Wide Band Anti-reflective Coating using $SiO_2$ and $Si_3N_4$ Films: On a glass substrate, a four-layer coating consisting of alternative layers of $Si_3N_4$ and $SiO_2$ was prepared. Table 2 sets forth the process data for the production of the oxide and nitride films. Substrate speed refers to how fast the sample was passing the plasma.

TABLE 2

| Layer | Thickness (Å) | Potential (V) | Current (A) | Pressure (μ) | No. Passes | Substrate Speed (in./min.) |
| --- | --- | --- | --- | --- | --- | --- |
| $Si_3N_4$ | 180 | 670 | 2.99 | 1.18 | 2 | 31.6 |
| $SiO_2$ | 250 | 501 | 4.00 | 1.02 | 3 | 21.8 |
| $Si_3N_4$ | 1375 | 670 | 3.00 | 1.15 | 10 | 20.7 |
| $SiO_2$ | 750 | 510 | 3.96 | 1.07 | 10 | 22.9 |

Curve 68 in FIG. 4 is the percent reflectance of the uncoated glass substrate. Curve 70 is the percent reflectance of the multi-layer film.

Wide Band Anti-reflective Coating using $SiO_2$ and $TiO_2$ Films: On a glass substrate, a four layer coating consisting of alternating layers of $TiO_2$ and $SiO_2$ was prepared. Table 3 sets forth the process data for the production of the oxides.

TABLE 3

| Layer | Thickness (Å) | Potential (V) | Power (kW) | Current (A) | Pressure (μ) | No. Passes | Substrate Speed (in/min) |
|---|---|---|---|---|---|---|---|
| $TiO_2$ | 130 | 468 | 40 | 92 | 3.0 | 1 | 22 |
| $SiO_2$ | 283 | 364 | 11.5 | 32 | 1.5 | 1 | 20 |
| $TiO_2$ | 1132 | 465 | 40 | 93 | 3.0 | 44 | 120 |
| $SiO_2$ | 861 | 365 | 10 | 27 | 1.5 | 26 | 160 |

Curve 72 of FIG. 5 is the percent reflectance of the unburnished film. Curve 74 is the percent reflectance of the burnished film.

After coating one side of the glass substrate with the oxides as described above, the other side of the substrate was also similarly coated. Curve 76 of FIG. 6 is the percent reflectance of an unburnished film. Curve 78 is the percent reflectance of the burnished film.

Enhanced Aluminum Mirrors: On a glass substrate, a five layer coating consisting of a single aluminum film followed by alternative layers of $SiO_2$ and $TiO_2$ was prepared. Table 4 sets forth the process data for the production of the aluminum and oxide films.

TABLE 4

| Layer | Thickness (Å) | Potential (V) | Power (kW) | Current (A) | Pressure (μ) | No. Passes | Substrate Speed (in/min) |
|---|---|---|---|---|---|---|---|
| Al | 650 | 512 | 30 | 55 | 1.5 | 1 | 88 |
| $SiO_2$ | 797 | 369 | 10 | 28 | 1.5 | 25 | 160 |
| $TiO_2$ | 510 | 449 | 40 | 96 | 1.5 | 22 | 130 |
| $SiO_2$ | 949 | 368 | 10 | 28 | 1.5 | 36 | 160 |
| $TiO_2$ | 532 | 452 | 40 | 96 | 1.5 | 23 | 130 |

FIG. 7 is a graph of the percent reflectance of the film measured against the wavelength of radiation over the visible spectrum. Reflectance was measured at a six (6) degree angle of incidence.

Although the invention has been described with respect to its preferred embodiments, it will be understood that the invention is to be protected within the full scope of the appended claims.

It is claimed:

1. A method of depositing a thin film of silicon based compound on a substrate within an evacuated chamber, said method comprising the steps of:
   (a) providing an elongated, cylindrical tubular member carrying a silicon sputtering material on an outer surface thereof;
   (b) establishing within said tubular member a magnetic field to provide an erosion zone on the sputtering material extending substantially the entire length of the tubular member and circumferentially along a relatively narrow region thereof;
   (c) causing a reactive gas to flow into said vacuum chamber;
   (d) causing an inert gas to flow into said vacuum chamber;
   (e) rotating said tubular member about its longitudinal axis to bring different portions of the sputtering material into sputtering position opposite the magnetic field;
   (f) applying d.c. potential to the cylindrical member to cause sputtering; and
   (g) positioning said substrate opposite said erosion zone, whereby a thin film of a silicon based compound is deposited on the substrate.

2. The method of claim 1 wherein the step of providing a cylindrical tubular member includes providing first and second elongated, cylindrical tubular members positioned adjacent each other, each of said first and second tubular members carrying a silicon sputtering material on an outer surface thereof, and further wherein the step of establishing a magnetic field includes establishing within each of said first and second tubular members respective first and second magnetic fields in order to provide an erosion zone on the sputtering material extending substantially the entire length of its respective tubular member and circumferentially along a relatively narrow region thereof.

3. The method of either of claims 1 or 2 wherein the step of causing a reactive gas to flow into the chamber includes causing an oxygen containing gas to flow thereinto, whereby the deposited film is a silicon oxide.

4. The method of either of claims 1 or 2 wherein the step of causing a reactive gas to flow into the chamber includes causing a nitrogen containing gas to flow thereinto, whereby the deposited film is a silicon nitride.

5. The method of either of claims 1 or 2 wherein the step of causing a reactive gas to flow into the chamber includes causing a carbon containing gas to flow thereinto, whereby the deposited film is a silicon carbide.

6. The method of either of claims 1 or 2, wherein the step of causing an inert gas to flow into the chamber includes causing argon to flow thereinto.

7. The method of either of claims 1 or 2 wherein said substrate is characterized by being vacuum compatible.

8. The method of either of claims 1 or 2 wherein said substrate includes any of a glass, plastic or metal.

9. The method of either of claims 1 or 2, wherein the step of providing a cylindrical member includes providing said outer surface with sputtering material consisting of at least 90% silicon.

10. The method of either of claims 1 or 2, wherein the step of providing a cylindrical member includes providing a member where the sputtering material is doped with one or more substances selected from the group consisting of aluminum, boron, antimony, phosphorus, and arsenic.

11. A method of depositing a silicon dioxide film on a substrate that is positioned within an evacuated chamber, said method comprising the steps of:
   (a) providing an elongated, cylindrical tubular member carrying a silicon sputtering material on an outer surface thereof;
   (b) establishing within said tubular member a magnetic field to provide an erosion zone on the sputtering material extending substantially the entire length of the tubular member and circumferentially along a relatively narrow region thereof;
   (c) causing an oxygen containing gas to flow into said vacuum chamber;
   (d) causing an inert gas to flow into said vacuum chamber;
   (e) rotating said tubular member about its longitudinal axis to bring different portions of the sputtering material into sputtering position opposite the magnetic field;
   (f) applying d.c. potential to the cylindrical member to cause sputtering; and
   (g) positioning said substrate opposite said erosion zone, whereby a thin silicon dioxide film is deposited on the substrate.

12. The method of claim 11 wherein the step of providing a cylindrical member includes providing said outer surface with sputtering material consisting of at least 98% silicon.

13. The method of claim 11 wherein the step of providing a cylindrical member includes providing a member where the sputtering material is doped with one or more substances selected from the group consisting of aluminum, boron, antimony, phosphorus, and arsenic.

* * * * *